United States Patent
Nitta et al.

(10) Patent No.: US 6,240,279 B1
(45) Date of Patent: May 29, 2001

(54) TRANSMISSION POWER CONTROL APPARATUS AND A RADIO COMMUNICATION APPARATUS INCLUDING THE TRANSMISSION POWER CONTROL APPARATUS

(75) Inventors: Tatsuo Nitta; Katsumi Hirai, both of Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/268,680

(22) Filed: Mar. 16, 1999

(30) Foreign Application Priority Data

Mar. 20, 1998 (JP) .................................................. 10-072307

(51) Int. Cl.$^7$ .................................................. H01Q 11/12
(52) U.S. Cl. .............................. 455/127; 455/91; 455/115
(58) Field of Search ................................ 455/69, 91, 115, 455/116, 126, 127, 217; 330/295, 298; 375/130; 370/320

(56) References Cited

U.S. PATENT DOCUMENTS

| | | | |
|---|---|---|---|
| 5,230,096 | * | 7/1993 | Davies et al. .......................... 455/217 |
| 5,530,923 | * | 6/1996 | Heinonen .............................. 455/126 |
| 5,590,419 | * | 12/1996 | Shimo .................................. 455/127 |
| 5,613,226 | * | 3/1997 | Kanami ................................ 455/115 |
| 5,722,063 | * | 2/1998 | Peterzell et al. ...................... 455/217 |
| 5,778,308 | * | 7/1998 | Sroka et al. .......................... 455/115 |
| 6,038,428 | * | 3/2000 | Mizusawa et al. .................... 455/126 |
| 6,072,995 | * | 6/2000 | Boesch et al. ........................ 455/127 |

* cited by examiner

*Primary Examiner*—Nay Maung
(74) *Attorney, Agent, or Firm*—Banner & Witcoff, Ltd.

(57) ABSTRACT

Two switches and a bypass line are provided to enable formation of a bypass route for transmitting a transmission signal bypassing a power amplifier. A configuration may be employed in which a first threshold value and a second threshold value that is a little bit lower than the first threshold value are set and the power amplifier is separated when the reception power exceeds the first threshold value and is connected when the reception power becomes lower than the second threshold value. That is, the power amplifier is connected and disconnected with hysteresis. This configuration can prevent the phenomenon that the power amplifier is connected and disconnected repeatedly and frequently in the above mentioned situation.

11 Claims, 4 Drawing Sheets

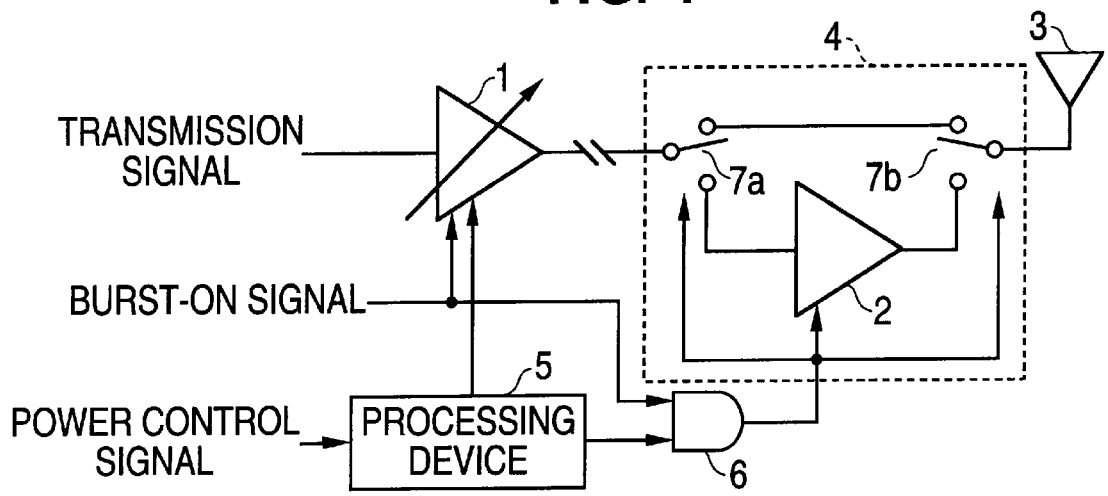
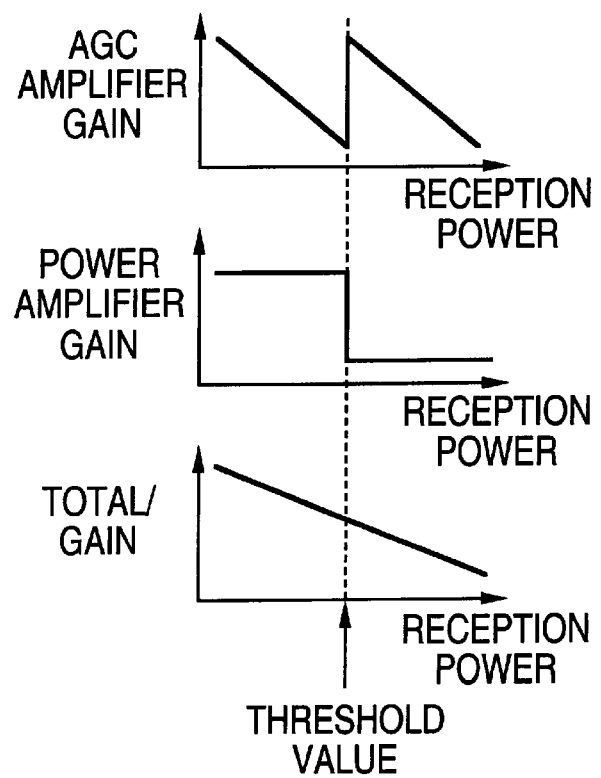

TRANSMISSION POWER CONTROL APPARATUS AND A RADIO COMMUNICATION APPARATUS INCLUDING THE TRANSMISSION POWER CONTROL APPARATUS

BACKGROUND OF THE INVENTION

1. Field of the Invention

The present invention relates to a transmission power control apparatus used for a transmission power control in a CDMA (code division multiple access) radio communication apparatus, for example, and a transmission power control unit used in such a transmission power control apparatus.

2. Description of the Related Art

For example, in a CDMA radio communication apparatus, the transmission power is controlled in accordance with the reception power.

FIG. 6 shows the configuration of a conventional radio transmitter having a function of performing such a transmission power control.

The radio transmitter is composed of an AGC amplifier 1, a power amplifier 2, and an antenna 3.

In a data transmitting operation, the AGC amplifier 1 and the power amplifier 2 are activated in response to a burst-on signal as a transmission request. A transmission signal is amplified by the AGC amplifier 1 and the power amplifier 2 and then supplied to the antenna 3. The transmission signal is transmitted from the antenna 3.

In the above radio transmitter, the transmission power control is performed in such a manner that the gain of the AGC amplifier 1 is varied in accordance with a power control signal that is generated through a calculation that is performed by a receiving section (not shown) based on the reception power. The gain of the power amplifier 2 is fixed. However, since the AGC amplifier 1 can provide a negative gain, a total gain that is lower than the gain of the power amplifier 2 can be obtained.

For example, if the gain of the power amplifier 2 is 30 dB and the dynamic range Of the gain of the AGC amplifier 1 is −20 to 50 dB, the dynamic range of the total gain of the radio transmitter is 10–80 dB.

FIG. 7 shows graphs showing relationships between the reception power and the gain of an AGC amplifier 1, the gain of a power amplifier 2, and the total gain in the radio transmitter of FIG. 6. As shown in FIG. 7, when the necessary total gain is relative low (i.e. the reception power is low level), the gain of the AGC amplifier 1 is negative because the gain of a power amplifier 2 is fixed.

FIG. 8 shows a relationship between the transmission power and the reception power in the above radio transmitter. In a range where the transmission power is relatively high, the power consumption decreases as the transmission power decreases. However, in a range where the transmission power is lower than a certain value, almost no decrease occurs in the power consumption even if the transmission power decreases.

The above fact means that unduly high power is consumed in the range where the transmission power is low. This is not preferable particularly in mobile communication apparatus (e.g. cellular telephone) or the like that use a battery whose capacity is limited. It causes the reduction of available speech time. Particularly, if the mobile communication apparatus is used as the CDMA radio communication apparatus (e.g. CDMA cellular telephone), this is very serious problem because the CDMA system requires wider dynamic range than other digital system like PDC (Japanese Personal Digital Cellular). So, if the consumed power in the range where the transmission is low becomes reduced, the available speech time is expected to be much longer.

As described above, conventionally, the transmission power is controlled by adjusting the gain of a variable gain amplifier while a certain gain is secured by a fixed gain amplifier. This causes a problem that a decrease in transmission power causes almost no decrease in power consumption in a range where the transmission power is lower than a certain value. It means that the power utilization efficiency is low.

SUMMARY OF THE INVENTION

The present invention has been made in view of the above circumstances in the art, and an object of the invention is therefore to provide a transmission power control apparatus which can decrease the power consumption as the transmission power decreases and can increase the power utilization efficiency, as well as a transmission power control unit used in such a transmission power control apparatus.

To attain the above object, according to a first aspect of the invention, there is provided a transmission power control apparatus comprising variable gain amplifying means such as an AGC amplifier for amplifying an input signal at a specified gain: fixed gain amplifying means such as a power amplifier connected in series to the variable gain amplifying means, for amplifying, at a fixed gain, the input signal amplified by the variable gain amplifying means, the variable gain amplifying means and the fixed gain amplifying means being for adjusting a level of a transmission signal to control transmission power; bypassing means constituted of two switches and a bypass line, for example, for forming a bypass route for transmitting the transmission signal so as to bypass the fixed gain amplifying means; and gain control means constituted of a processing device and an AND gate, for example, for specifying the gain of the variable gain amplifying means so that the transmission power has a necessary value, for causing the bypassing means to form the bypassing route if the necessary value of the transmission power is smaller than a predetermined threshold value, and for, if necessary, specifying the gain of the variable gain amplifier at a value that includes a gain part that the fixed gain amplifying means should bear if it were not bypassed, in a state that the bypass route is formed by the gain control means.

With the above configuration, when the necessary transmission power is greater than the predetermined threshold value, the variable gain amplifying means and the fixed gain amplifying means provides a sufficiently large gain. When the necessary transmission power is smaller than the predetermined threshold value, the bypassing means formed the bypass route and separates the fixed gain amplifying means. A necessary gain is obtained by the variable gain amplifying means alone, whereby the power consumption of the fixed gain amplifying means is reduced.

According to a second aspect of the invention, in the transmission power control apparatus according to the first aspect, a predetermined, first threshold value and a predetermined, second threshold value that is greater than the first predetermined value are set as the predetermined threshold value: and the gain control means causes the bypassing means to form the bypass route in response to an event that the necessary value of the transmission power becomes smaller than the first threshold value in a state that the bypass route is not formed, and causes the bypassing means to finish formation of the bypass route in response to an event that the necessary value of the transmission power becomes greater than the second threshold value in a state that the bypass route is formed.

According to a third aspect of the invention, in the transmission power control apparatus according to the first aspect, a predetermined, first threshold value and a predetermined, second threshold value that is greater than the first value are set as the predetermined threshold value; and the gain control means specifies the gain of the variable gain amplifying means in accordance with reception power in a receiving device, causes the bypassing means to form the bypass route in response to an event that the reception power becomes greater than a value corresponding to the first threshold value in a state that the bypass route is not formed, and causes the bypassing means to finish formation of the bypass route in response to an event that the reception power becomes smaller than a value corresponding to the second threshold value in a state that the bypass route is formed.

According to the second and third aspects of the invention, the fixed gain amplifying means is connected and disconnected with hysteresis, which prevents the fixed gain amplifying means from being connected and disconnected repeatedly at a high frequency.

According to a fourth aspect of the invention, there is provided a transmission power control unit comprising fixed gain amplifying means such as a power amplifier for amplifying an input signal at a fixed gain; and bypassing means constituted of two switches and a bypass line, for example, for forming a bypass route for transmitting the input signal so as to bypass the fixed gain amplifying means in accordance with an external instruction (e.g., an instruction indicating whether to form the bypass route).

The fourth aspect of the invention makes it possible to easily realize the transmission power control unit to be used in each of the first to third aspects of the invention.

BRIEF DESCRIPTION OF THE DRAWINGS

FIG. 1 is a block diagram showing the configuration of the main part of a radio transmitter to which a transmission power control apparatus according to an embodiment of the invention is applied;

FIG. 2 is graphs showing relationships between the reception power and the gain of an AGC amplifier 1, the gain of a power amplifier 2, and the total gain in the radio transmitter of FIG. 1;

DETAILED DESCRIPTION OF THE PREFERRED EMBODIMENT

An embodiment of the present invention will be hereinafter described with reference to the accompanying drawings.

Figure 5:
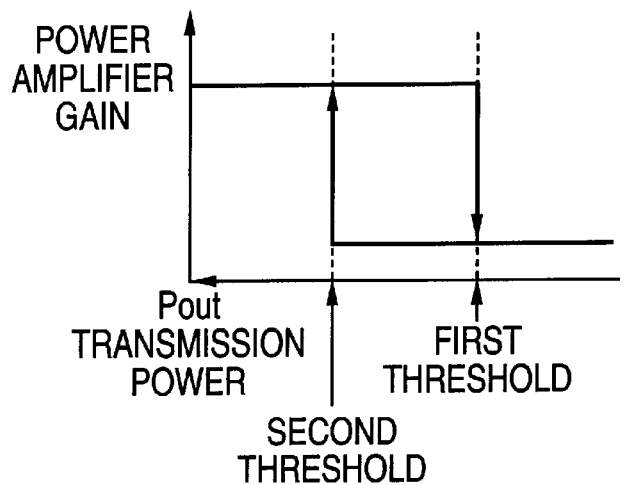
FIG. 5 is a graph showing a relationship between the transmission power and the gain of the power amplifier 2 in a case where the power amplifier 2 is connected and disconnected with hysteresis.
Figure 6:
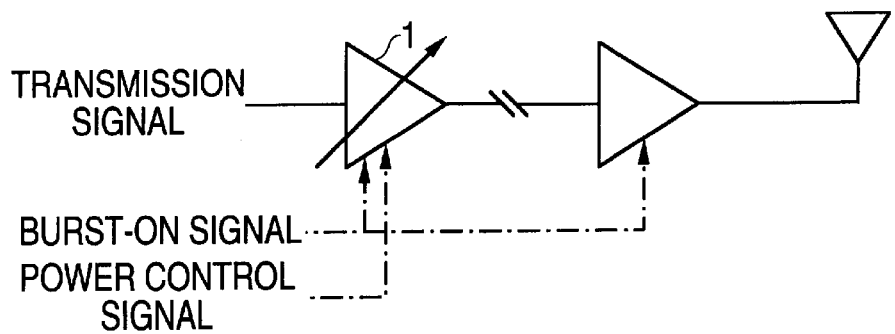
FIG. 6 shows the configuration of a conventional radio transmitter having a transmission power control function.
Figure 7:
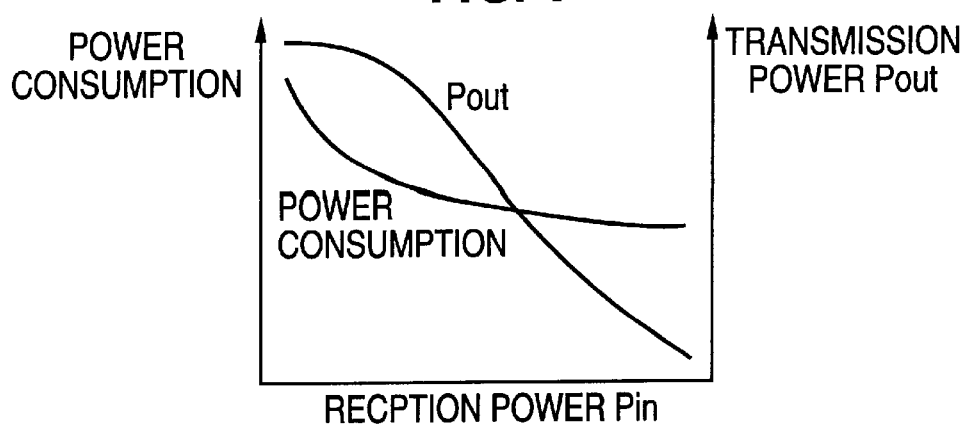
FIG. 7 is graphs showing relationships between the reception power and the gain of an AGC amplifier 1, the gain of a power amplifier 2, and the total gain in the radio transmitter of FIG. 6.
Figure 8:
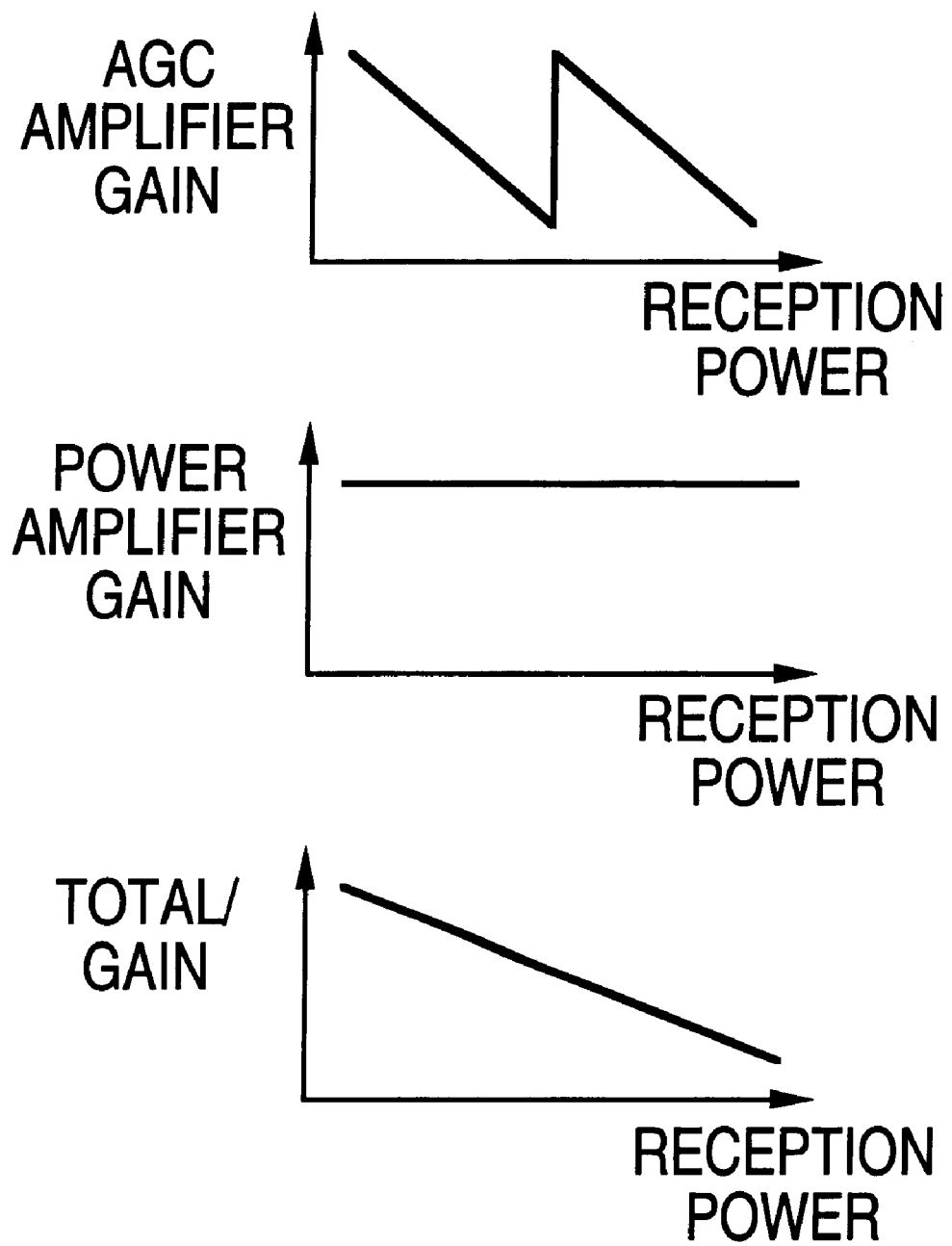
FIG. 8 is a graph showing a relationship between the transmission power and the reception power in the radio transmitter of FIG. 6.

FIG. 1 is a block diagram showing the configuration of the main part of a radio transmitter to which a transmission power control apparatus of this embodiment is applied. The components in FIG. 1 that are the same as in FIG. 5 are given the same reference symbols as in FIG. 6.

The radio transmitter shown in FIG. 1 has an AGC amplifier 1, an antenna 3, a transmission power control unit 4, a processing device 5, and an AND gate 6.

The AGC amplifier 1, which operates when receiving a burst-on signal as a data transmission request, amplifies an input transmission signal at a gain that is specified by the processing device 5.

The antenna 3 transmits a transmission signal that is supplied from the transmission power control unit 4.

The transmission power control unit 4 has a power amplifier 2, switches 7a and 7b, and a bypass line 8. The power amplifier 2, which operates when receiving a burst-on signal as a data transmission request, amplifies a transmission signal, at a fixed gain, a transmission signal that is supplied from the AGC amplifier 1 via the switch 7a. The switches 7a and 7b chooses the power amplifier 2 or the bypass line 8 in accordance with the state of a burst-on signal that is supplied via the AND gate 6. When chosen by the switches 7a and 7b, the bypass line 8 forms a bypass route for guiding a transmission signal to the antenna 3 bypassing the power amplifier 2.

The processing devise 5 determines the gain of the AGC amplifier 1 based on a power control signal that is generated through a calculation that is performed by a receiving section (not shown) based on the reception power, and informs the AGC amplifier 1 of the determined gain. Further, the processing device 5 judges, based on the power control signal, whether the reception power is lower than or equal to a predetermined threshold value, and supplies the AND gate 6 with a gate signal that reflects a judgment result.

The AND gate 6 supplies or does not supply a burst-on signal to the transmission power control unit 4 in accordance with the state of a gate signal that is supplied from the processing device 5.

Next, the operation of the radio transmitter having the above configuration will be described.

When a burst-on signal as a data transmission request is supplied to the radio transmitter, a power control signal that has been generated through a calculation that is performed based on the reception power is also supplied to the processing device 5 at the same time.

Based on the power control signal, the processing device 5 judges whether the reception power is higher than the predetermined threshold value. If the reception power is not higher than the predetermined threshold value, the processing device 5 supplies a "H"-level (high level) gate signal to the AND gate 6. As a result, the AND gate 6 is rendered in an on-state, that is, a state that it supplies a burst-on signal to the transmission power control unit 4.

In the transmission power control unit 4 that is receiving a burst-on signal indicating a transmission request, the power amplifier 2 is rendered operational and the switches 7a and 7b are rendered in a state of choosing the power amplifier 2.

Therefore, in this state, a transmission signal is amplified by the AGC amplifier 1 and further amplified by the power amplifier 2.

At this time, the processing device 5 determines the gain of the AGC amplifier 1 so that the total gain of the AGC amplifier 1 and the power amplifier 2 becomes a gain that provides a necessary transmission power value, and informs the AGC amplifier 1 of the gain thus determined.

On the other hand, if the reception power exceeds the threshold value, the processing device 5 supplies a "L"-level (low level) gate signal to the AND gate 6. As a result, the AND gate 6 is rendered in an off-state and stops supplying a burst-on signal to the transmission power control unit 4.

In the transmission control unit 4 that is not receiving a burst-on signal, the power amplifier 2 is rendered non-operational and the switches 7a and 7b are rendered in a state of choosing the bypass line 8. That is, the power amplifier 2 is separated from the transmission route of a transmission signal.

Therefore, in this state, a transmission signal is supplied to the antenna 3 along the bypass route that bypasses the power amplifier 2, and hence is amplified by the AGC amplifier 1 alone.

At this time, the processing device 5 determines the gain of the AGC amplifier 1 at a gain that provides a necessary transmission power value, and informs the AGC amplifier 1 of the gain thus determined.

With the above operation, as shown in FIG. 2, the power amplifier 2 is rendered operational when the reception power is lower than the threshold value, that is, a transmission power value higher than a predetermined value is needed. On the other hand, the power amplifier 2 is rendered non-operational when the reception power exceeds the threshold value, that is, the necessary transmission power is lower than or equal to the predetermined value.

The AGC amplifier 1 has a gain characteristic in which basically the gain decreases as the reception power increases. However, as shown in FIG. 2, in a range where the reception power is higher than the threshold value, the gain of the AGC amplifier 1 is increased by a gain part that the power amplifier 2 should bear if it were not bypassed.

As a result, as shown in FIG. 2, a total gain characteristic is obtained in which the total gain decreases linearly as the reception power increases.

As described above, in this embodiment, the power amplifier 2 is rendered operational and a sufficiently large gain is secured when the reception power is relatively low and hence the necessary transmission power is high. On the other hand, when the reception power is so high that the necessary transmission power can be obtained by the gain of the AGC amplifier 1 alone, a transmission signal is supplied to the antenna 3 via the bypass line 8 that bypasses the power amplifier 2; the power amplifier 2 is separated and the power consumption there is reduced.

Figure 3:
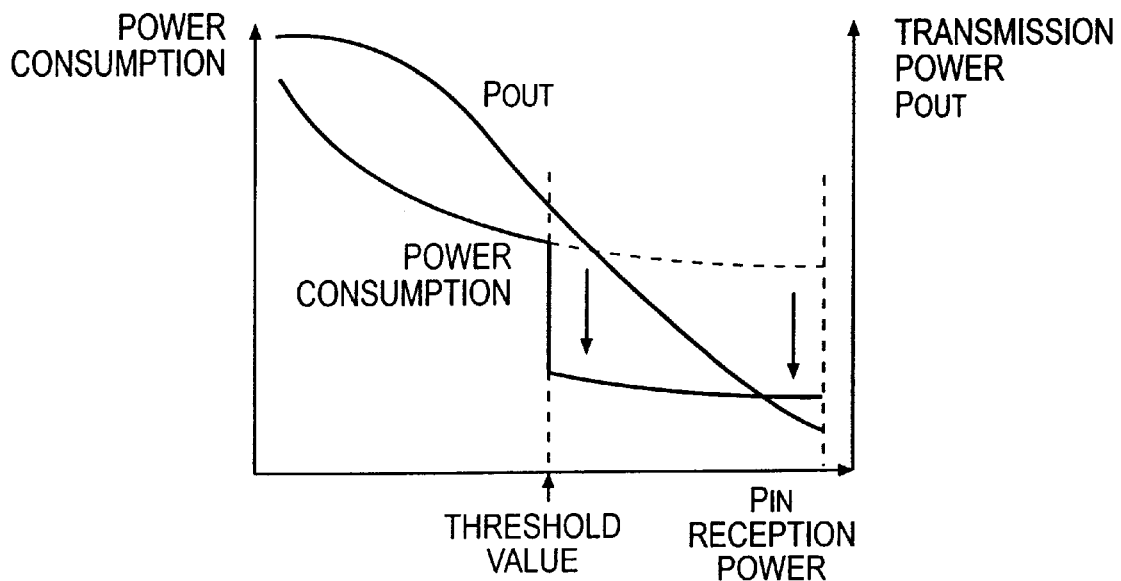
FIG. 3 is a graph showing a relationship between the reception power and the power consumption in the radio transmitter of FIG. 1.

As a result, as shown in FIG. 3, the power consumption can greatly be reduced when the transmission power can be low, and the power utilization efficiency can be increased.

Figure 4:
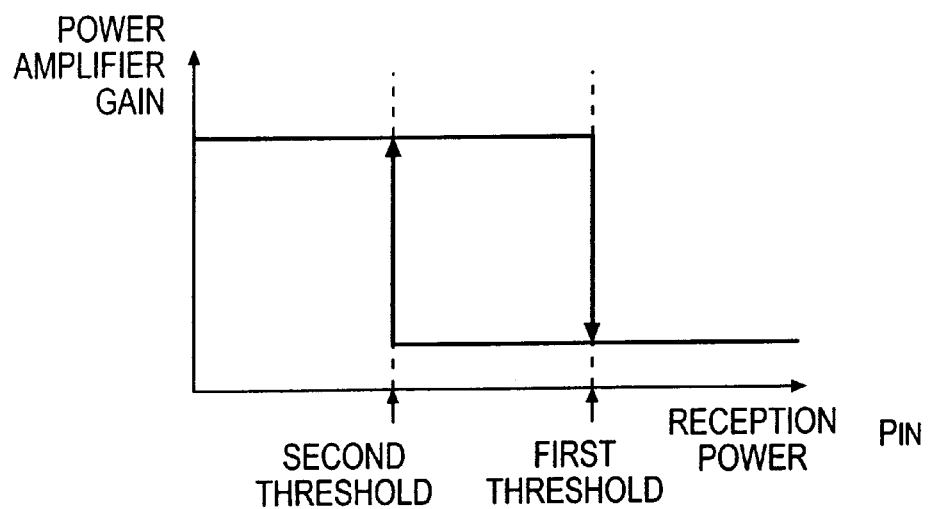
FIG. 4 is a graph showing a relationship between the reception power and the gain of the power amplifier 2 in a case where the power amplifier 2 is connected and disconnected with hysteresis.

In the above embodiment, the connection/disconnection switching of the power amplifier 2 is performed depending on whether the reception power exceeds a single threshold value. Therefore, there is fear that the power amplifier 2 is connected and disconnected repeatedly and frequently if the reception power varies in the neighborhood of the threshold value. In view of this, a configuration may be employed in which a first threshold value and a second threshold value that is a little bit lower than the first threshold value are set as shown in FIG. 4. The power amplifier 2 is separated when the reception power exceeds the first threshold value and is connected when the reception power becomes lower than the second threshold value. The value between the first threshold and the second threshold may be 3 dB, for example. The power amplifier 2 is connected and disconnected with hysteresis. This configuration can prevent the phenomenon that the power amplifier 2 is connected and disconnected repeatedly and frequently in the above-mentioned situation.

As is the same, a configuration may be employed in which a first threshold value and a second threshold value that is a little bit lower than the first threshold value are set as shown in FIG. 5 and the power amplifier 2 is separated when the transmission power exceeds the first threshold value and is connected when the transmission power becomes lower than the second threshold value. That is, the power amplifier 2 is connected and disconnected with hysteresis. This configuration can prevent the phenomenon that the power amplifier 2 is connected and disconnected repeatedly and frequently in the above-mentioned situation.

In the above embodiments, the power amplifier 2 is rendered non-operational by interrupting the supply of a burst-on signal to it. If the supply of power to the power amplifier 2 is interrupted, power consumption, if any, that occurs in the power amplifier 2 when it is in a stand-by state can be prevented. This enables further increase in power utilization efficiency.

Since the above embodiment is directed to a radio transmitter that is applied to a system in which the transmission power is determined in accordance with the reception power, the connection/disconnection of the power amplifier 2 is managed based on the reception power. The connection/disconnection of the power amplifier 2 may be managed based on any information that enables judgment of the reception power. It goes without saying that the connection/disconnection of the power amplifier 2 may be managed based on the transmission power itself.

The invention can also be applied to a case where the radio transmitter includes another variable gain amplifier in addition to the AGC amplifier 1. In this case, the gain of the AGC amplifier 1 and that of the other variable gain amplifier may be set arbitrarily so that their total gain characteristic becomes the same as the gain characteristic of the AGC amplifier 1 in the above embodiment.

Other various modifications are possible without departing from the spirit and scope of the invention.

What is claimed is:

1. A transmission power control apparatus being able to control a power level of the transmission signal comprising:
   variable gain amplifying means for amplifying an input signal at a specified gain;
   fixed gain amplifying means connected in series to the variable gain amplifying means, for amplifying, at a fixed gain, the input signal amplified by the variable gain amplifying means, the variable gain amplifying means and the fixed gain amplifying means being for adjusting the power level of the transmission signal;
   bypassing means for forming a bypass route for transmitting the transmission signal so as to bypass the fixed gain amplifying means; and
   gain control means for specifying the gain of the variable gain amplifying means so that the transmission power has a necessary value, and for determining whether the bypassing means is formed the bypass route or not by comparing the necessary value of the transmission power with a predetermined first threshold value and a predetermined second threshold value which is higher than the first threshold value.

2. The transmission power control apparatus according to claim 1, wherein the gain control means for causing the bypassing means to form the bypassing route if the necessary value of transmission power is lower than the first threshold value in a state that the bypassing route has not been formed, and for causing the bypassing means not to form the bypassing route if the necessary value of transmission power is higher than the second threshold value in a state that the bypassing route has been formed.

3. The transmission power control apparatus according to claim 2, wherein in a state that the bypass route is formed by the gain control means specifying the gain of the variable gain amplifier at a value that includes a gain part that the fixed gain amplifying means should bear if it were not bypassed.

4. A transmission power control apparatus being able to control a power level of the transmission signal based on a power level of a reception signal comprising:

variable gain amplifying means for amplifying an input signal at a specified gain;

fixed gain amplifying means connected in series to the variable gain amplifying means, for amplifying, at a fixed gain, the input signal amplified by the variable gain amplifying means, the variable gain amplifying means and the fixed gain amplifying means being for adjusting the power level of the transmission signal;

bypassing means for forming a bypass route for transmitting the transmission signal so as to bypass the fixed gain amplifying means; and gain control means for specifying the gain of the variable gain amplifying means so that the transmission power has a necessary value, and for determining whether the bypassing means is formed the bypass route or not by comparing the power level of the reception signal with a predetermined first threshold value and a predetermined second threshold value which is higher than the first threshold value.

5. The transmission power control apparatus according to claim 4, wherein the gain control means for causing the bypassing means to form the bypassing route if the power level of reception signal is lower than the first threshold value in a state that the bypassing route has not been formed, and for causing the bypassing means not to form the bypassing route if the power level of the reception signal is higher than the second threshold value in a state that the bypassing route has been formed.

6. The transmission power control apparatus according to claim 4, wherein in a state that the bypass route is formed by the gain control means specifying the gain of the variable gain amplifier at a value that includes a gain part that the fixed gain amplifying means should bear if it were not bypassed.

7. A radio communication apparatus being able to transmit a signal being adjusted its power level comprising:

variable gain amplifying means for amplifying an input signal at a specified gain;

fixed gain amplifying means connected in series to the variable gain amplifying means, for amplifying, at a fixed gain, the input signal amplified by the variable gain amplifying means, the variable gain amplifying means and the fixed gain amplifying means being for adjusting the power level of the transmission signal;

bypassing means for forming a bypass route for transmitting the transmission signal so as to bypass the fixed gain amplifying means;

gain control means for specifying the gain of the variable gain amplifying means so that the transmission power has a necessary value, and for determining whether the bypassing means is formed the bypass route or not by comparing the necessary value of the transmission power with a predetermined first threshold value and a predetermined second threshold value which is higher than the first threshold value; and antenna means for transmitting the signal amplified by the variable gain amplifying means in a state the bypassing means is formed the bypass route and for transmitting the signal amplified by the variable gain amplifying means and the fixed gain amplifying means in a state that the bypassing means is not formed the bypass route.

8. The radio communication apparatus according to claim 7, wherein the gain control means for causing the bypassing means to form the bypassing route if the necessary value of transmission power is lower than the first threshold value in a state that the bypassing route has not been formed, and for causing the bypassing means not to form the bypassing route if the necessary value of transmission power is higher than the second threshold value in a state that the bypassing route has been formed.

9. The radio communication apparatus according to claim 7, wherein the power level of the transmission signal is controlled based on a power level of a reception signal; and the gain control means for causing the bypassing means to form the bypassing route if the power level of reception signal is lower than the first threshold value in a state that the bypassing route has not been formed, and for causing the bypassing means not to form the bypassing route if the power level of the reception signal is higher than the second threshold value in a state that the bypassing route has been formed.

10. The radio communication apparatus according to claim 7, wherein in a state that the bypass route is formed by the gain control means specifying the gain of the variable gain amplifier at a value that includes a gain part that the fixed gain amplifying means should bear if it were not bypassed.

11. The radio communication apparatus according to claim 7, wherein the radio communication apparatus is used as a cellular telephone in a CDMA (Code Division Multiple Access) system.

* * * * *